(12) United States Patent
Du

(10) Patent No.: US 10,304,404 B2
(45) Date of Patent: May 28, 2019

(54) GOA CIRCUITS AND LIQUID CRYSTAL DISPLAYS

(71) Applicant: Shenzhen China Star Optoelectronics Technology Co., Ltd., Shenzhen, Guangdong (CN)

(72) Inventor: Peng Du, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 136 days.

(21) Appl. No.: 15/509,499

(22) PCT Filed: Feb. 15, 2017

(86) PCT No.: PCT/CN2017/073593
§ 371 (c)(1),
(2) Date: Mar. 8, 2017

(87) PCT Pub. No.: WO2018/129784
PCT Pub. Date: Jul. 19, 2018

(65) Prior Publication Data
US 2018/0233098 A1    Aug. 16, 2018

(51) Int. Cl.
*G09G 3/36* (2006.01)
*G02F 1/13* (2006.01)
*G02F 1/133* (2006.01)

(52) U.S. Cl.
CPC .............. *G09G 3/3677* (2013.01); *G02F 1/13* (2013.01); *G02F 1/13306* (2013.01);
(Continued)

(58) Field of Classification Search
CPC ......... G09G 3/3677; G09G 2310/0264; G09G 2310/0286; G09G 2310/08
(Continued)

(56) References Cited

U.S. PATENT DOCUMENTS 9,311,880 B2    4/2016 Dai
9,524,689 B2    12/2016 Dai
(Continued)

FOREIGN PATENT DOCUMENTS

CN          106297698 A    1/2017
KR    1020120131463 A    12/2012

*Primary Examiner* — Michael Pervan
(74) *Attorney, Agent, or Firm* — Andrew C. Cheng

(57) ABSTRACT

A gate driver on array (GOA) and a liquid crystal display are disclosed. The GOA circuit includes a plurality of cascaded GOA units and a plurality of pull-down maintaining circuits. The cascaded GOA units are configured for respectively outputting gate driving signals of first level signals to charge corresponding horizontal scanning lines within a display area when being controlled by a plurality of clock signals. Each of the pull-down maintaining circuits corresponds to at least two cascaded GOA units, and each of the pull-down maintaining circuits is configured for maintaining the corresponding at least two cascaded GOA units to output second level signals as the gate driving signals during a non-operation period. As described above, the disclosure can reduce the amount of the pull-down maintaining circuits, so as to decrease the width of the layout of the GOA circuit to meet the need to design a narrow-frame liquid crystal display.

20 Claims, 7 Drawing Sheets

(52) U.S. Cl.
CPC ............... *G09G 2300/0408* (2013.01); *G09G 2310/0264* (2013.01); *G09G 2310/0286* (2013.01); *G09G 2310/08* (2013.01)

(58) Field of Classification Search
USPC ........................................ 345/100; 377/64–81
See application file for complete search history.

(56) References Cited

U.S. PATENT DOCUMENTS

| | | | | |
|---|---|---|---|---|
| 2010/0150302 A1* | 6/2010 | Tsai | ...................... | G11C 19/28 377/79 |
| 2015/0187312 A1* | 7/2015 | Dai | ...................... | G09G 3/3648 345/213 |
| 2017/0236480 A1* | 8/2017 | Dai | ...................... | G09G 3/3677 345/213 |

* cited by examiner

GOA CIRCUITS AND LIQUID CRYSTAL DISPLAYS

BACKGROUND OF THE INVENTION

1. Field of the Invention

The present disclosure relates to liquid crystal display technology, and more particularly to a gate driver on array (GOA) and a liquid crystal display.

2. Discussion of the Related Art

The conventional gate driver on array (GOA) circuit includes cascaded GOA units and a plurality of pull-down maintaining circuits. One GOA unit needs one or two pull-down maintaining circuits to maintain the pull-down. In practice, the pull-down maintaining circuit are composed of a plurality of transistors. Due that the amount of the transistor is more, the pull-down maintaining circuits usually occupy a lot of space. As such, when the amount of the transistor is more, the width of the layout of the GOA circuit can be increased, as so to increase the difficulty to design a narrow-frame liquid crystal display.

SUMMARY

The present disclosure relates to a gate driver on array (GOA) and a liquid crystal display, which can decrease the width of the layout of the GOA circuit, so as to reduce the difficulty to design a narrow-border liquid crystal display.

In one aspect, a gate driver on array (GOA) circuit applied in liquid crystal displays is provided. The GOA circuit includes a plurality of cascaded GOA units; wherein the cascaded GOA units are configured for respectively outputting gate driving signals of first level signals to charge corresponding horizontal scanning lines within a display area when being controlled by a plurality of clock signals; the GOA circuit further includes a plurality of pull-down maintaining circuits, each of the pull-down maintaining circuits corresponds to at least two cascaded GOA units, and each of the pull-down maintaining circuits is configured for maintaining the corresponding at least two cascaded GOA units to output second level signals as the gate driving signals during a non-operation period; wherein when the number of the clock signals is N, each one or each two of the pull-down maintaining circuits corresponds to N/2 of the cascaded GOA units; and wherein the cascaded GOA units include an eleventh transistor, a twelfth transistor, a thirteenth transistor, a fourteenth transistor, a fifteenth transistor and a second capacitor; a gate and a source of the eleventh transistor are connected and then connect with turn-on signals at a previous level; a drain of the eleventh transistor respectively connects with a source of the twelfth transistor, a gate of the thirteenth transistor, a gate of the fourteenth transistor, one end of the second capacitor, and a common signal point; a gate of the twelfth transistor connects with a gate of the fifteenth transistor; a source of the thirteenth transistor and a source of the fourteenth transistor are connected and then connects with the clock signals; a drain of the thirteenth transistor outputs the turn-on signals at a current level, a drain of the fourteenth transistor respectively connects with the other end of the second capacitor and the source of the fifteenth transistor to output the gate driving signals; and a drain of the twelfth transistor and a drain of the fifteenth transistor connect with a negative-voltage constant-voltage source.

Wherein each of the pull-down maintaining circuits includes an input unit and an output unit.

The input unit includes a first transistor, a second transistor, a third transistor, a fourth transistor, a fifth transistor, a sixth transistor, a seven transistor, an eighth transistor, a ninth transistor, a tenth transistor, and a first capacitor; wherein a gate and a source of the first transistor and a source of the second transistor are connected and then connect with first input signals; a drain of the first transistor respectively connects with a source of the third transistor and a gate of the fourth transistor; a gate of the second transistor respectively connects with a gate of the third transistor, and a source and a gate of the fifth transistor; a drain of the second transistor connects with a source of the fourth transistor; a drain of the fifth transistor respectively connects with a drain of the sixth transistor, a source of the seventh transistor, one end of the first capacitor, and a gate of the ninth transistor; a gate and a source of the six transistor are connected and then connects with second input signals; a gate of the seventh transistor connects with a gate of the tenth transistor and reset signals; a gate and a source of the eighth transistor are connected and then connect with third input signals; a drain of the eighth transistor connects with a source of the ninth transistor; a drain of the ninth transistor respectively connects to the other end of the first capacitor and a source of the tenth transistor; a drain of the third transistor, a drain of the fourth transistor, a drain of the seventh transistor, and a drain of the tenth transistor are connected and then connect with fourth input signals.

The output unit includes a plurality of transistors; when the number of the transistors is equal to the number of the clock signals N, gates of the transistors are respectively connected and then connect with a drain of the ninth transistor in the input unit, and drains of the transistors are respectively connected and then connect with fourth input signals, and source of the transistors respectively connect to the common signal points of N/2 number of the GOA units and the gate driving signals.

In another aspect, a gate driver on array (GOA) circuit applied in liquid crystal displays is provided. The GOA circuit includes a plurality of cascaded GOA units, the cascaded GOA units being configured for respectively outputting gate driving signals of a first level signals to charge corresponding horizontal scanning lines within a display area when being controlled by a plurality of clock signals; the GOA circuit further includes a plurality of pull-down maintaining circuits, each of the pull-down maintaining circuits corresponds to at least two cascaded GOA units, and each of the pull-down maintaining circuits is configured for maintaining the corresponding at least two cascaded GOA units to output second level signals as the gate driving signals during a non-operation period.

Wherein when the number of the clock signals is N, each one or each two of the pull-down maintaining circuits corresponds to N/2 of the cascaded GOA units.

Wherein each of the pull-down maintaining circuits includes an input unit and an output unit.

The input unit includes a first transistor, a second transistor, a third transistor, a fourth transistor, a fifth transistor, a sixth transistor, a seven transistor, an eighth transistor, a ninth transistor, a tenth transistor, and a first capacitor; wherein a gate and a source of the first transistor and a source of the second transistor are connected and then connect with first input signals; a drain of the first transistor respectively connects with a source of the third transistor and a gate of the fourth transistor; a gate of the second transistor respectively connects with a gate of the third transistor, and a source and a gate of the fifth transistor; a drain of the second transistor connects with a source of the fourth transistor; a drain of the fifth transistor respectively connects with a drain of the sixth transistor, a source of the seventh transistor, one end of the first capacitor, and a gate of the ninth transistor; a gate and a source of the six transistor are connected and then connects with second input signals; a gate of the seventh transistor connects with a gate of the tenth transistor and reset signals; a gate and a source of the eighth transistor are connected and then connect with third input signals; a drain of the eighth transistor connects with a source of the ninth transistor; a drain of the ninth transistor respectively connects with the other end of the first capacitor and a source of the tenth transistor; a drain of the third transistor, a drain of the fourth transistor, a drain of the seventh transistor, and a drain of the tenth transistor are connected and then connect with fourth input signals.

The output unit includes a plurality of transistors; when the number of the transistors is equal to the number of the clock signals N, gates of the transistors are respectively connected and then connect a drain of the ninth transistor in the input unit, and drains of the transistors are respectively connected and then connect with fourth input signals, and sources of the transistors respectively connect with the common signal points of N/2 number of the GOA units and gate driving signals.

Wherein when the number of the clock signals is eight, each of the pull-down maintaining circuits corresponds to four cascaded GOA units, the first input signals of the pull-down maintaining circuit at the M-th level are a positive-voltage constant-voltage source, the second input signals are level transfer signals at the (M−1)-th level, and the fourth input signals are a negative-voltage constant-voltage source; wherein the drain of the ninth transistor of the pull-down maintaining circuit at the M-th level outputs the level transfer signals at the M-th level; and wherein a phase of the third input signals of the pull-down maintaining circuit at the M-th level is opposite to the phase of the third input signals of the pull-down maintaining circuit at the (M+1)-th level.

Wherein when the number of the clock signals is eight, every two pull-down maintaining circuits corresponds to four cascaded GOA units, the first input signals of the pull-down maintaining circuits at the M-th level are first low-frequency signals, the second input signals are the level transfer signals at the (M−2)-th level, the fourth input signals are a negative-voltage constant-voltage source, the first input signals of the pull-down maintaining circuits at the (M+1)-th level are second low-frequency signals, the second input signals are the level transfer signals at the (M−1)-th level, the third input signals are second control signals, and the fourth input signals are a negative-voltage constant-voltage source; wherein the third input signals of the pull-down maintaining circuit at the M-th level are the same with the third input signals of the pull-down maintaining circuit at the (M+1)-th level, and the phase of the third input signals of the pull-down maintaining circuit at the M-th level is opposite to the phase of the third input signals of the two adjacent pull-down maintaining circuits; wherein the drain of the ninth transistor of the pull-down maintaining circuit at the M-th level outputs the level transfer signals at the M-th level, and the drain of the ninth transistor of the pull-down maintaining circuit at the (M+1)-th level outputs the level transfer signals at the (M+1)-th level.

Wherein the phase of the first low-frequency signals is opposite to the phase of the second low-frequency signals.

Wherein a polarity of the first low-frequency signals and the second low-frequency signals is switched for every pre-determined image frames, and the pre-determined image frames has a range from 1 to 100 frames.

Wherein the pull-down maintaining circuits at the M-th level and at the (M+1)-th level are operated alternatively when being controlled by the first low-frequency signals and the second low-frequency signals.

Wherein the cascaded GOA units include an eleventh transistor, a twelfth transistor, a thirteenth transistor, a fourteenth transistor, a fifteenth transistor and a second capacitor; a gate and a source of the eleventh transistor are connected and then connect to turn-on signals at a previous level; a drain of the eleventh transistor respectively connects with a source of the twelfth transistor, a gate of the thirteenth transistor, a gate of the fourteenth transistor, one end of the second capacitor, and a common signal point; a gate of the twelfth transistor connects with a gate of the fifteenth transistor; a source of the thirteenth transistor and a source of the fourteenth transistor are connected and then connects with the clock signals; a drain of the thirteenth transistor outputs the turn-on signals at a current level, a drain of the fourteenth transistor respectively connects with the other end of the second capacitor and the source of the fifteenth transistor to output the gate driving signals; and a drain of the twelfth transistor and a drain of the fifteenth transistor connect with a negative-voltage constant-voltage source.

In another aspect, a liquid crystal display includes a gate driver on array (GOA) circuit. The GOA circuit includes a plurality of cascaded GOA units, the cascaded GOA units being configured for respectively outputting gate driving signals of a first level signals to charge corresponding horizontal scanning lines within a display area when being controlled by a plurality of clock signals; the GOA circuit further includes a plurality of pull-down maintaining circuits, each of the pull-down maintaining circuits corresponds to at least two cascaded GOA units, and each of the pull-down maintaining circuits is configured for maintaining the corresponding at least two cascaded GOA units to output second level signals as the gate driving signals during a non-operation period.

Wherein when the number of the clock signals is N, each one or each two of the pull-down maintaining circuits corresponds to N/2 of the cascaded GOA units.

Wherein each of the pull-down maintaining circuits includes an input unit and an output unit.

The input unit includes a first transistor, a second transistor, a third transistor, a fourth transistor, a fifth transistor, a sixth transistor, a seven transistor, an eighth transistor, a ninth transistor, a tenth transistor, and a first capacitor; wherein a gate and a source of the first transistor and a source of the second transistor are connected and then connect with first input signals; a drain of the first transistor respectively connects with a source of the third transistor and a gate of the fourth transistor; a gate of the second transistor respectively connects with a gate of the third transistor, and a source and a gate of the fifth transistor; a drain of the second transistor connects with a source of the fourth transistor; a drain of the fifth transistor respectively connects with a drain of the sixth transistor, a source of the seventh transistor, one end of the first capacitor, and a gate of the ninth transistor; a gate and a source of the six transistor are connected and then connects with second input signals; a gate of the seventh transistor connects with a gate of the tenth transistor and reset signals; a gate and a source of the eighth transistor are connected and then connect with third input signals; a drain of the eighth transistor connects with a source of the ninth transistor; a drain of the ninth transistor respectively connects with the other end of the first capacitor and a source of the tenth transistor; a drain of the third transistor, a drain of the fourth transistor, a drain of the seventh transistor, and a drain of the tenth transistor are connected and then connect with fourth input signals.

The output unit includes a plurality of transistors; when the number of the transistors is equal to the number of the clock signals N, gates of the transistors are respectively connected and then connect a drain of the ninth transistor in the input unit, and drains of the transistors are respectively connected and then connect with fourth input signals, and sources of the transistors respectively connect with the common signal points of N/2 number of the GOA units and gate driving signals.

Wherein when the number of the clock signals is eight, each of the pull-down maintaining circuits corresponds to four cascaded GOA units, the first input signals of the pull-down maintaining circuit at the M-th level are a positive-voltage constant-voltage source, the second input signals are level transfer signals at the (M−1)-th level, and the fourth input signals are a negative-voltage constant-voltage source; wherein the drain of the ninth transistor of the pull-down maintaining circuit at the M-th level outputs the level transfer signals at the M-th level; and wherein a phase of the third input signals of the pull-down maintaining circuits at the M-th level is opposite to the phase of the third input signals of the pull-down maintaining circuits at the (M+1)-th level.

Wherein when the number of the clock signals is eight, every two pull-down maintaining circuits corresponds to four cascaded GOA units, the first input signals of the pull-down maintaining circuit at the M-th level are first low-frequency signals, the second input signals are the level transfer signals at the (M−2)-th level, the fourth input signals are a negative-voltage constant-voltage source, the first input signals of the pull-down maintaining circuit at the (M+1)-th level are second low-frequency signals, the second input signals are the level transfer signals at the (M−1)-th level, the third input signals are second control signals, and the fourth input signals are a negative-voltage constant-voltage source; wherein the third input signals of the pull-down maintaining circuit at the M-th level are the same with the third input signals of the pull-down maintaining circuit at the (M+1)-th level, and the phase of the third input signals of the pull-down maintaining circuit at the M-th level is opposite to the third input signals of two adjacent pull-down maintaining circuits; wherein the drain of the ninth transistor of the pull-down maintaining circuit at the M-th level outputs the level transfer signals at the M-th level, and the drain of the ninth transistor of the pull-down maintaining circuit at the (M+1)-th level outputs the level transfer signals at the (M+1)-th level.

Wherein the phase of the first low-frequency signals is opposite to the phase of the second low-frequency signals.

Wherein a polarity of the first low-frequency signals and the second low-frequency signals is switched for every pre-determined image frames, and the pre-determined image frames has a range from 1 to 100 frames.

Wherein the pull-down maintaining circuits at the M-th level and at the (M+1)-th level are operated alternatively when being controlled by the first low-frequency signals and the second low-frequency signals.

Wherein the cascaded GOA units include an eleventh transistor, a twelfth transistor, a thirteenth transistor, a fourteenth transistor, a fifteenth transistor and a second capacitor; a gate and a source of the eleventh transistor are connected and then connect to turn-on signals at a previous level; a drain of the eleventh transistor respectively connects with a source of the twelfth transistor, a gate of the thirteenth transistor, a gate of the fourteenth transistor, one end of the second capacitor, and a common signal point; a gate of the twelfth transistor connects with a gate of the fifteenth transistor; a source of the thirteenth transistor and a source of the fourteenth transistor are connected and then connects with the clock signals; a drain of the thirteenth transistor outputs the turn-on signals at a current level, a drain of the fourteenth transistor respectively connects with the other end of the second capacitor and the source of the fifteenth transistor to output the gate driving signals; and a drain of the twelfth transistor and a drain of the fifteenth transistor connect with a negative-voltage constant-voltage source.

In view of the above, each of the pull-down maintaining circuits in the GOA circuit and the liquid crystal display of the disclosure is configured for maintaining the corresponding at least cascaded GOA units to output second level signals as the gate driving signals during a non-operation period, which can reduce the amount of the pull-down maintaining circuits, and can decrease the width of the layout of the GOA circuit, therefore meet the need to design a narrow-frame liquid crystal display.

DETAILED DESCRIPTION OF THE EMBODIMENTS

Among the specification and the scope of subsequent terms are used to refer to specific components. Those of skill in the art will appreciate that manufacturers may use different terms to refer to the same components. The patent specification and subsequent differences in the name of the range is not to be used as a way to distinguish between the components, but with differences in the functional components as distinguished benchmarks. Embodiments of the invention will now be described more fully hereinafter with reference to the accompanying drawings, in which embodiments of the invention are shown.

Figure 1:
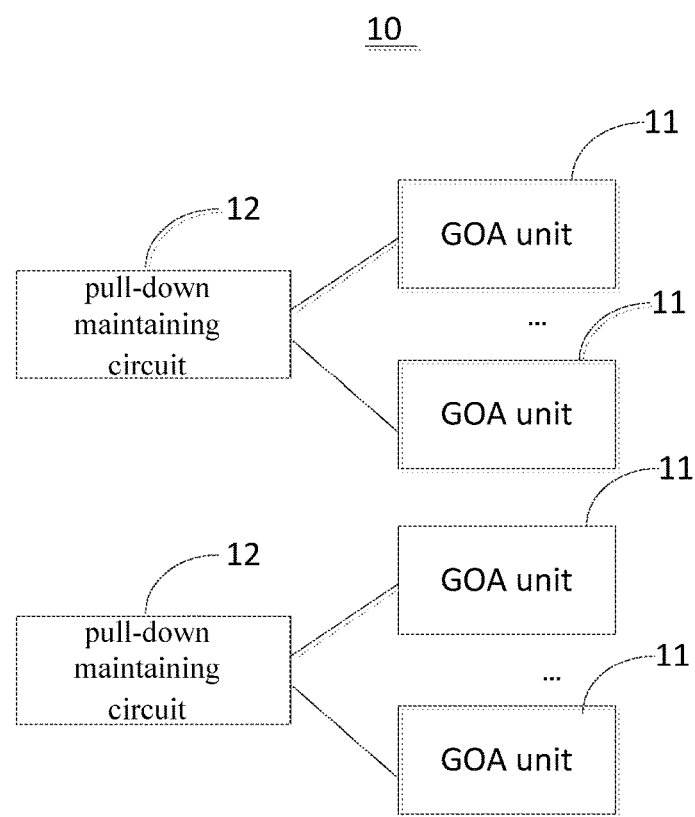
FIG. 1 is a schematic view of the GOA circuit in accordance with a first embodiment.

FIG. 1 is a schematic view of the GOA circuit in accordance with a first embodiment. As shown in FIG. 1, the GOA circuit 10 includes a plurality of cascaded GOA units 11 and a plurality of pull-down maintaining circuits 12.

The cascaded GOA units 11 are configured for respectively outputting gate driving signals of first level signals to charge corresponding horizontal scanning lines within a display area when being controlled by a plurality of clock signals. The first level signals are high-level signals. Each of the pull-down maintaining circuits 12 corresponds to at least two cascaded GOA units 11, and each of the pull-down maintaining circuits is configured for maintaining the corresponding at least two cascaded GOA units to output second level signals as the gate driving signals during a non-operation period. The second level signals are low-level signals.

Preferably, when the number of the clock signals is N, each one or each two of the pull-down maintaining circuits 12 corresponds to N/2 of the cascaded GOA units 11.

Figure 2:
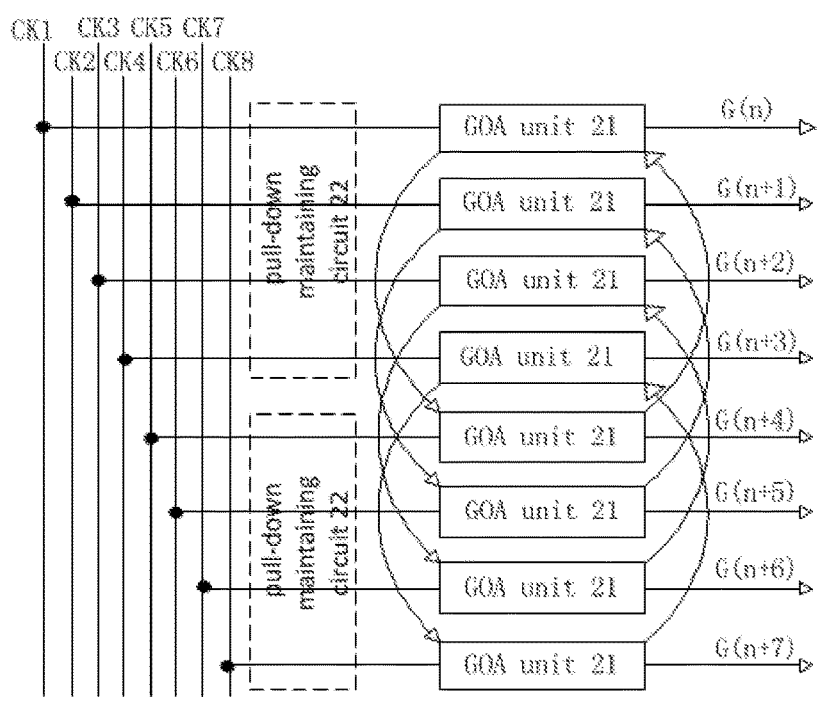
FIG. 2 is a schematic view of the GOA circuit in accordance with a second embodiment.

FIG. 2 is a schematic view of the GOA circuit in accordance with a second embodiment. In this embodiment, the GOA circuit is formed based on 8 clock signals. As shown in FIG. 2, the GOA circuit 20 includes a plurality of cascaded GOA units 21 and a plurality of pull-down maintaining circuits 22.

The cascaded GOA units 21 are configured for respectively outputting gate driving signals G(n)(n=1, 2, ... N) of first level signals to charge corresponding horizontal scanning lines within a display area when being controlled by eight clock signals CKn(n=1, 2, ... 8). The first level signals are high-level signals.

The connection relationship between the cascaded GOA units 21 and the eight clock signals is: the GOA unit 21 at the first level connects with the clock signal CK1, the GOA unit 21 at the second level connects with the clock signal CK2, ... so on, the GOA unit 21 at the eighth level connects with the clock signal CK8. Then repeat again, that is, the GOA unit 21 at the ninth level connects with the clock signal CK1, the GOA unit 21 at the tenth level connects with the clock signal CK2, ... so on, the GOA unit 21 at the sixteenth level connects with the clock signal CK8. Then repeat again until all the GOA units 21 connect with the corresponding clock signals. In the embodiment, the eight clock signals CKn(n=1, 2, ... 8) are valid in sequence.

Figure 3:
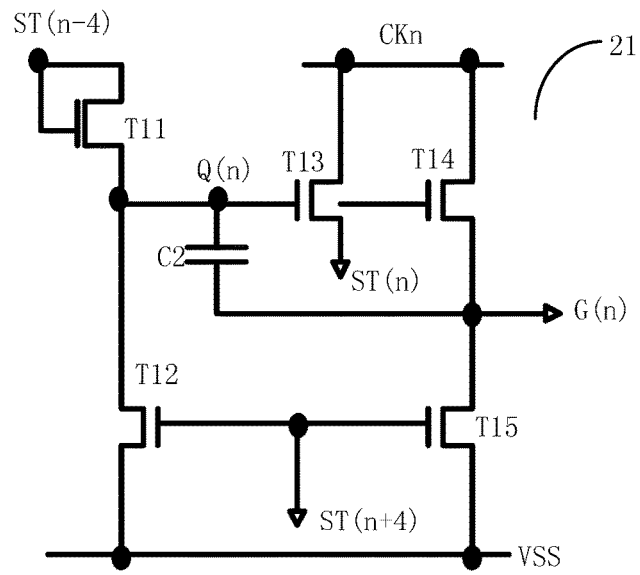
FIG. 3 is a circuit diagram of the GOA unit of the GOA circuit of FIG. 2.

Referring to FIG. 3, FIG. 3 is a circuit diagram of the GOA unit of the GOA circuit of FIG. 2. As shown in FIG. 3, the GOA unit 21 at the N-th level includes an eleventh transistor T11, a twelfth transistor T12, a thirteenth transistor T13, a fourteenth transistor T14, a fifteenth transistor T15 and a second capacitor C2.

A gate and a source of the eleventh transistor T11 are connected and then connect with turn-on signals at a previous level. In the embodiment, the turn-on signals at the previous level are the turn-on signals ST(n−4) at the (n−4)-th level. A drain of the eleventh transistor T11 respectively connects with a source of the twelfth transistor T12, a gate of the thirteenth transistor T13, a gate of the fourteenth transistor T14, one end of the second capacitor C2, and a common signal point. In the embodiment, the common signal point is a common signal point Q(n) at the n-th level. A gate of the twelfth transistor T12 connects with a gate of the fifteenth transistor T15, and outputs the turn-on signals at a next level. In the embodiment, the turn-on signals at the next level are the turn-on signals ST(n+4) at the (n+4)-th level. A source of the thirteenth transistor T13 and a source of the fourteenth transistor T14 are connected and then connect with the clock signals CKn. A drain of the thirteenth transistor T13 outputs the turn-on signals at a current level. In the embodiment, the turn-on signals at the current level are the turn-on signals ST(n) at the n-th level. A drain of the fourteenth transistor T14 respectively connects to the other end of the second capacitor C2 and a source of the fifteenth transistor T15 to output the gate driving signals. In the embodiment, the gate driving signals are gate driving signals G(n) at the n-th level. A drain of the twelfth transistor T12 and a drain of the fifteenth transistor T15 connect with a negative-voltage constant-voltage source VSS.

In the embodiment, the eleventh transistor T11 is configured for connecting the turn-on signals ST(n−4) at the (n−4)-th level such that while the GOA unit 21 at the n-th level is turned on, the common signal point Q(n) at the n-th level is pulled at the high level. The fourteenth transistor T14 is configured for outputting high level signals as gate driving signals G(n) at the n-th level to charge the corresponding horizontal scanning lines during the operation period. The thirteenth transistor T13 is configured for outputting the turn-on signals ST(n) at the n-th level during the non-operation period of the GOA unit at the n-th level such that the GOA unit at the next level, that is, at the (n+4)-th level is turned on. The twelfth transistor T12 and the fifteenth transistor T15 are configured for pulling down the common signal point Q(n) at the n-th level and the gate driving signals G(n) at the n-th level during the non-operation period of the GOA unit at the n-th level.

Referring to the FIG. 2, in the embodiment, each of the pull-down maintaining circuits 22 corresponds to four GOA units 21. Each of the pull-down maintaining circuits 22 is configured for maintaining the corresponding four GOA units to output second level signals as the gate driving signals during the non-operation period, wherein the second level signals are low-level signals.

Figure 4:
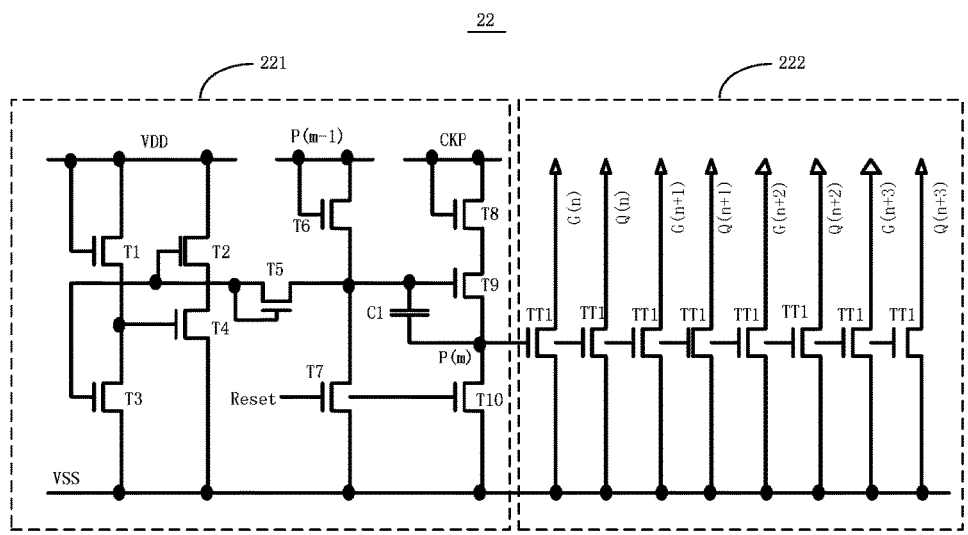
FIG. 4 is a circuit diagram of the pull-down maintaining circuit of the GOA circuit of FIG. 2.

Please also referring to FIG. 4, FIG. 4 is a circuit diagram of the pull-down maintaining circuit of the GOA circuit of FIG. 2. As shown in FIG. 4, the pull-down maintaining circuit 22 includes an input unit 221 and an output unit 222.

The input unit 221 includes a first transistor T1, a second transistor T2, a third transistor T3, a fourth transistor T4, a fifth transistor T5, a sixth transistor T6, a seven transistor T7, an eighth transistor T8, a ninth transistor T9, a tenth transistor T10, and a first capacitor C1.

A gate and a source of the first transistor T1 and a source of the second transistor T2 are connected and then connect with first input signals. A drain of the first transistor T1 respectively connects with a source of the third transistor T3 and a gate of the fourth transistor T4. A gate of the second transistor T2 respectively connects with a gate of the third transistor T3, and a source and a gate of the fifth transistor T5. A drain of the second transistor T2 connects with a source of the fourth transistor T4. A drain of the fifth transistor T5 respectively connects with a drain of the sixth transistor T6, a source of the seventh transistor T7, one end of the first capacitor C1, and a gate of the ninth transistor T10. A gate and a source of the six transistor T6 are connected and then connects with second input signals. A gate of the seventh transistor T7 connects with a gate of the tenth transistor T10 and reset signals Reset. A gate and a source of the eighth transistor T8 are connected and then connect with third input signals. A drain of the eighth transistor T8 connects with a source of the ninth transistor T9. A drain of the ninth transistor T9 respectively connects with the other end of the first capacitor C1 and a source of the tenth transistor T10. A drain of the third transistor T3, a drain of the fourth transistor T4, a drain of the seventh transistor T7, and a drain of the tenth transistor T10 are connected and then connect with fourth input signals.

The output unit 222 includes eight transistors TT1, and the number of the transistors is equal to the number of the clock signals.

In the embodiment, gates of the eight transistors TT1 are respectively connected, and then connect with the drain of the ninth transistor T9 in the input unit 221. Drains of the eight transistors are respectively connected, and then connect with the four input signals. Sources of the eight transistors respectively connect with the common signal points and the gate driving signals of the corresponding four GOA units.

In the embodiment, take the pull-down maintaining circuit 22 as the pull-down maintaining circuit at the M-th level as an example. The first input signals of the pull-down maintaining circuit 22 are a positive-voltage constant-voltage source VDD. The second input signals are the level transfer signals P(m−1) at the (m−1)-th level. The third input signals are the first control signals CKP. The fourth input signals are a negative-voltage constant-voltage source VSS.

The drain of the ninth transistor T9 of the pull-down maintaining circuit 22 at the M-th level outputs the level transfer signals P(m) at the M-th level.

In addition, in the embodiment, the phase of the third input signals of the pull-down maintaining circuit 22 at the M-th level is opposite to the phase of the third input signals of the pull-down maintaining circuit 22 at the (M+1)-th level. That is, the phase of the third input signals of the pull-down maintaining circuit 22 at the (M+1)-th level is the inverse phase of the first control signals XCKP.

In the embodiment, the sources of the eight transistors TT1 of the pull-down maintaining circuit 22 at the M-th level respectively connect with common signal point Q(n) at the N-th level, common signal point Q(n+1) at the (N+1)-th level, common signal point Q(n+2) at the (N+2)-th level, common signal point Q(n+3) at the (N+3)-th level, and the gate driving signals G(n) at the N-th level, the gate driving signals G(n+1) at the (N+1)-th level, the gate driving signals G(n+2) at the (N+2)-th level, the gate driving signals G(n+3) at the (N+3)-th level.

Figure 5:
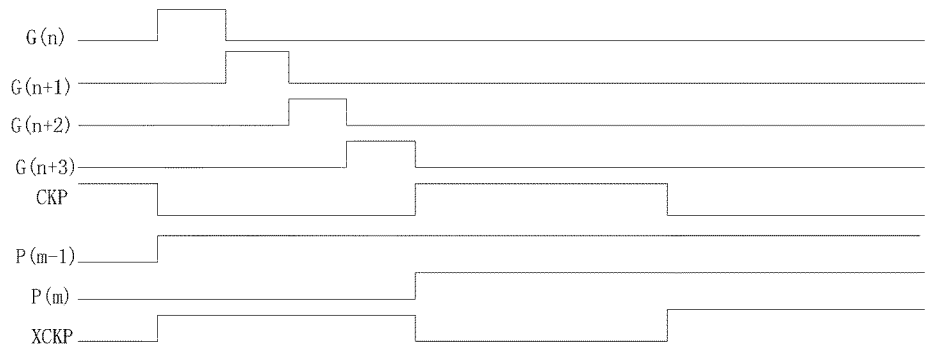
FIG. 5 is a timing diagram of the pull-down maintaining circuit of FIG. 4.

Referring to FIG. 5, FIG. 5 is a timing diagram of the pull-down maintaining circuit of FIG. 4. As shown in FIG. 5, when the GOA units 21 at the N-th level to (N+3)-th level output the gate driving signals, the level transfer signals P(m) at the M-th level in the pull-down maintaining circuit 22 at the M-th level are always at the low level. As such, it is sure that the GOA units 21 at the N-th level to (N+3)-th level output the gate driving signals G(n), G(n+1), G(n+3) at the N-th level to (N+3)-th level. After the GOA units 21 at the N-th level to (N+3)-th level output the gate driving signals, the level transfer signals P(m) at the M-th level is switched at the high level, the eight transistors TT1 can be controlled at the same time such that all the common signal points Q(n), Q(n+1), Q(n+2), Q(n+3) at the N-th, (N+1)-th, (N+2)-th, (N+3)-th level in the GOA units 21 at the N-th level to (N+3)-th level and all the gate driving gates G(n), G(n+1), G(n+2), G(n+3) at the N-th, (N+1)-th, (N+2)-th, (N+3)-th level are pulled down at the level of the negative-voltage constant-voltage source VSS.

During the display of an image frame, the level transfer signals P(m) at the M-th level in the pull-down maintaining circuit 22 are maintained at the high level after being switched to be at the high level, and the level transfer signals P(m) at the M-th level are pulled down to be at the low level by the reset signals Reset before the display of the next image frame.

Figure 6:
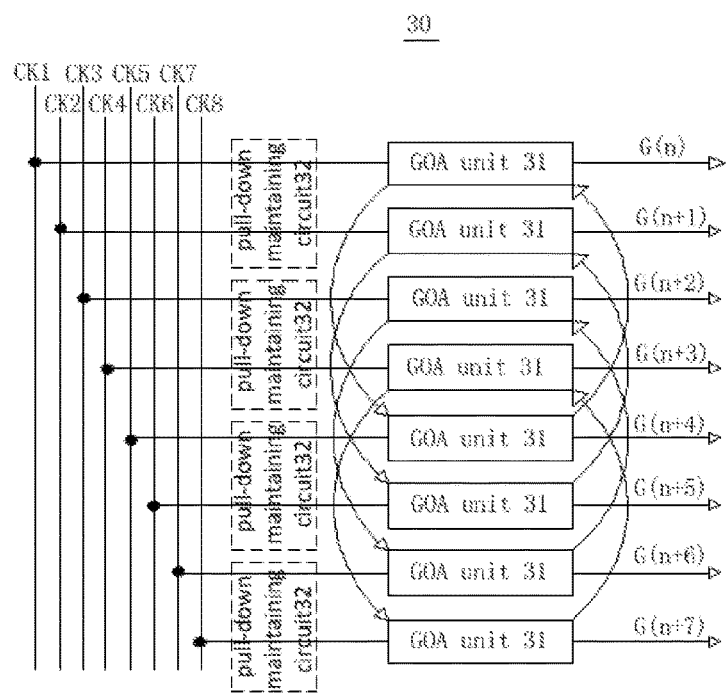
FIG. 6 is a schematic view of the GOA circuit in accordance with a third embodiment.

FIG. 6 is a schematic view of the GOA circuit in accordance with a third embodiment. In this embodiment, the GOA circuit is formed based on eight clock signals. As shown in FIG. 6, the GOA circuit 30 includes a plurality of cascaded GOA units 31 and a plurality of pull-down maintaining circuits 32. The difference between the GOA circuit 30 of FIG. 6 and the GOA circuit 20 of FIG. 2 is: every two pull-down maintaining circuits 32 correspond to four GOA units 31.

The GOA unit 31 in this embodiment is the same with the GOA unit 21 of the second embodiment, as shown in FIG. 2, and thus will be omitted hereinafter.

Figure 7:
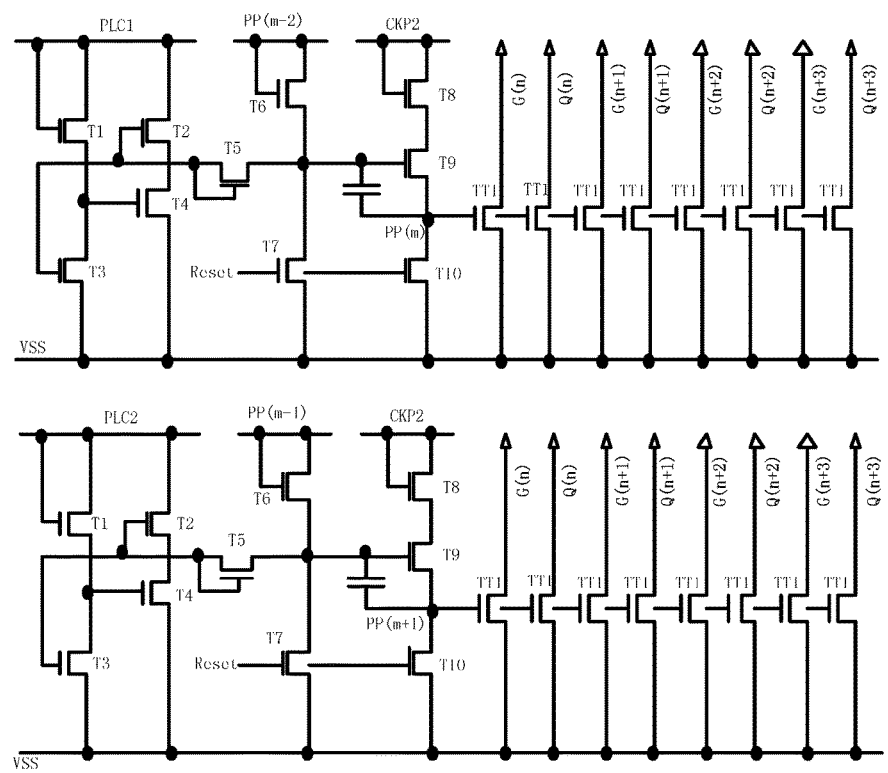
FIG. 7 is a circuit diagram of two pull-down maintaining circuits corresponding to four GOA units of FIG. 6.

Referring to FIG. 7, FIG. 7 is a circuit diagram of two pull-down maintaining circuits corresponding to four GOA units of FIG. 6. As shown in FIG. 7, take the two pull-down maintaining circuits 32 that include a pull-down maintaining circuit 32 at the M-th level and a pull-down maintaining circuit 32 at the (M+1)-th level as the example. The difference between the pull-down maintaining circuit 32 in this embodiment and the pull-down maintaining circuit 22 of the second embodiment in FIG. 2 is:

The first input signals of the pull-down maintaining circuit 32 at the M-th level are first low-frequency signals PLC1, the second input signals are level transfer signals PP(m−2) at the (M−2)-th level, the third input signals are second control signals CKP2, and the fourth input signals are a negative-voltage constant-voltage source VSS. The first input signals of the pull-down maintaining circuit 32 at the (M+1)-th level are second low-frequency signals PLC2, the second input signals are level transfer signals PP(m−1) at the (M−1)-th level, the third input signals are the second control signals CKP2, and the fourth input signals are the negative-voltage constant-voltage source VSS.

The drain of the ninth transistor T9 of the pull-down maintaining circuits 32 at the M-th level outputs the level transfer signal PP(m) at the M-th level, and the drain of the ninth transistor T9 of the pull-down maintaining circuits 32 at the (M+1)-th level outputs the level transfer signal PP(m+1) at the (M+1)-th level.

The third input signals of the pull-down maintaining circuit at the M-th level are the same with the third input signals of the pull-down maintaining circuit at the (M+1)-th level, and the phase of the third input signals of the pull-down maintaining circuit at the M-th level is opposite to the phase of the third input signals of two adjacent pull-down maintaining circuits. That is, the third input signals of two adjacent pull-down maintaining circuits is the inverse phase of the second control signals XCKP2.

The phase of the first low-frequency signals PLC1 is opposite to the phase of the second low-frequency signals PLC2.

A polarity of the first low-frequency signals PLC1 and the second low-frequency signals PLC2 is switched for every pre-determined image frames, and the pre-determined image frames has a range from 1 to 100 frames.

The pull-down maintaining circuit 32 at the M-th level and the pull-down maintaining circuit 32 at the (M+1)-th level are operated alternatively when being controlled by the first low-frequency signals PLC1 and the second low-frequency signals PLC2.

Figure 8:
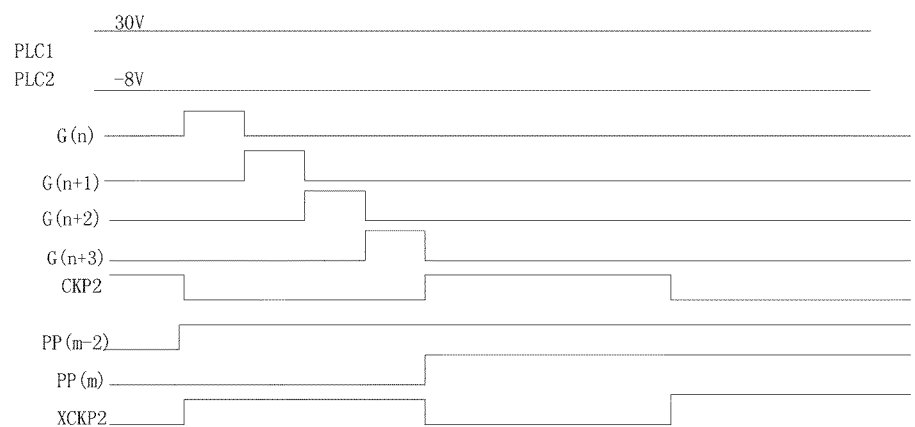
FIG. 8 is a timing diagram of the pull-down maintaining circuit of FIG. 7 at the M-th level.
Figure 9:
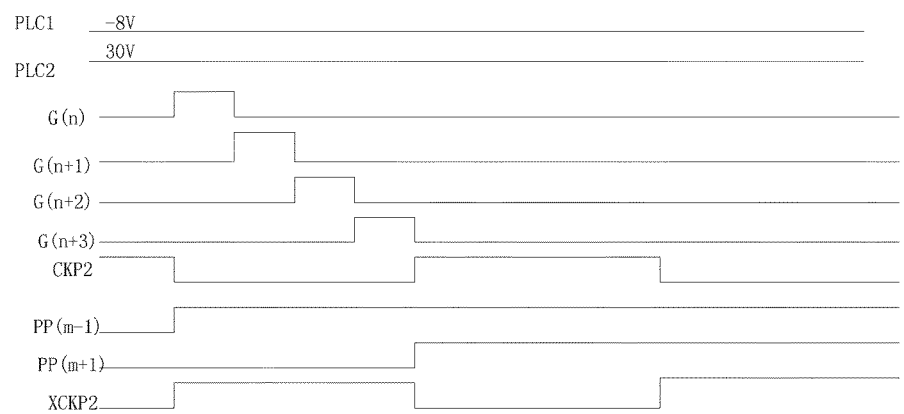
FIG. 9 is a timing diagram of the pull-down maintaining circuit of FIG. 7 at the (M+1)-th level.

Referring to FIG. 8 and FIG. 9, FIG. 8 is a timing diagram of the pull-down maintaining circuit of FIG. 7 at the M-th level, and FIG. 9 is a timing diagram of the pull-down maintaining circuit of FIG. 7 at the (M+1)-th level. As shown in FIG. 8 and FIG. 9, when the first low-frequency signals PLC1 are at the high level, for example, 30V, and when the second low-frequency signals PLC2 are at the low level, for example, −8V, the pull-down maintaining circuit 32 at the M-th level are operated normally. When the second low-frequency signals PLC2 are at the high level, for example, 30V, and when the first low-frequency signals PLC1 are at the low level, for example, −8V, the pull-down maintaining circuit 32 at the (M+1)-th level are operated normally.

In the embodiment, due that a polarity of the first low-frequency signals PLC1 and the second low-frequency signals PLC2 is switched for every pre-determined image frames, and the two pull-down maintaining circuits, the pull-down maintaining circuit at the M-th level and the pull-down maintaining circuit at the (M+1)-th level, operate alternatively, which avoids that only one pull-down maintaining circuit in the embodiment of FIG. 2 is operated for long time such that the transistors suffer the voltage stress to cause the problem of the I-V shift, therefore increasing the reliability of the GOA circuit.

Figure 10:
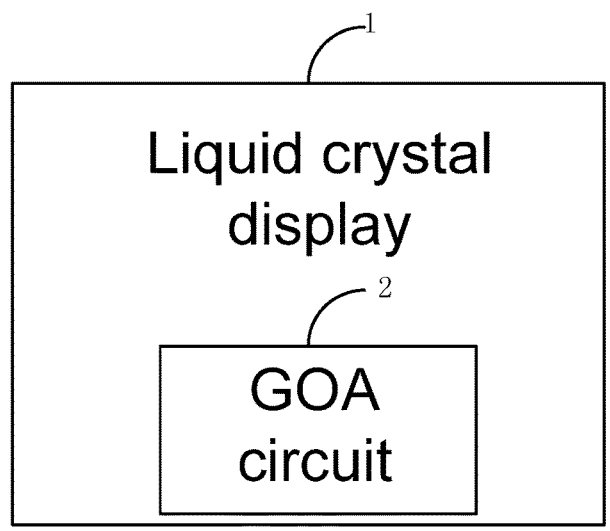
FIG. 10 is a schematic view of the LCD in accordance with one embodiment.

FIG. 10 is a schematic view of the liquid crystal display in accordance with one embodiment. As shown in FIG. 10, the liquid crystal display 1 includes a GOA circuit 2. The GOA circuit 2 is the GOA circuit 10, the GOA circuit 20, or the GOA circuit 30.

The beneficial effects of the disclosure are: each of the pull-down maintaining circuits in the GOA circuit and the liquid crystal display of the disclosure is configured for maintaining the corresponding at least cascaded GOA units to output second level signals as the gate driving signals during a non-operation period, which can reduce the amount of the pull-down maintaining circuits, and can decrease the width of the layout of the GOA circuit, therefore meet the need to design a narrow-frame liquid crystal display.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A gate driver on array (GOA) circuit applied in liquid crystal displays, comprising:
a plurality of cascaded GOA units, the cascaded GOA units being configured for respectively outputting gate driving signals of first level signals to charge corresponding horizontal scanning lines within a display area when being controlled by a plurality of clock signals;
the GOA circuit further comprising a plurality of pull-down maintaining circuits, each of the pull-down maintaining circuits corresponding to at least two cascaded GOA units, and each of the pull-down maintaining circuits being configured for maintaining the corresponding at least two cascaded GOA units to output second level signals as the gate driving signals during a non-operation period;
wherein when the number of the clock signals is N, each one or each two of the pull-down maintaining circuits corresponds to N/2 of the cascaded GOA units; and
wherein each of the cascaded GOA units comprises an eleventh transistor, a twelfth transistor, a thirteenth transistor, a fourteenth transistor, a fifteenth transistor and a second capacitor; a gate and a source of the eleventh transistor are connected and then connect with turn-on signals at a previous level; a drain of the eleventh transistor respectively connects with a source of the twelfth transistor, a gate of the thirteenth transistor, a gate of the fourteenth transistor, one end of the second capacitor, and a common signal point; a gate of the twelfth transistor connects with a gate of the fifteenth transistor; a source of the thirteenth transistor and a source of the fourteenth transistor are connected and then connects with the clock signals; a drain of the thirteenth transistor outputs the turn-on signals at a current level, a drain of the fourteenth transistor respectively connects to the other end of the second capacitor and a source of the fifteenth transistor to output the gate driving signals; and a drain of the twelfth transistor and a drain of the fifteenth transistor connect with a negative-voltage constant-voltage source.

2. The GOA circuit as claimed in claim 1, wherein each of the pull-down maintaining circuits comprises an input unit and an output unit; and
the input unit comprises a first transistor, a second transistor, a third transistor, a fourth transistor, a fifth transistor, a sixth transistor, a seven transistor, an eighth transistor, a ninth transistor, a tenth transistor, and a first capacitor; wherein a gate and a source of the first transistor and a source of the second transistor are connected and then connect with first input signals; a drain of the first transistor respectively connects with a source of the third transistor and a gate of the fourth transistor; a gate of the second transistor respectively connects with a gate of the third transistor, and a source and a gate of the fifth transistor; a drain of the second transistor connects with a source of the fourth transistor; a drain of the fifth transistor respectively connects with a drain of the sixth transistor, a source of the seventh transistor, one end of the first capacitor, and a gate of the ninth transistor; a gate and a source of the six transistor are connected and then connects with second input signals; a gate of the seventh transistor connects with a gate of the tenth transistor and reset signals; a gate and a source of the eighth transistor are connected and then connect with third input signals; a drain of the eighth transistor connects with a source of the ninth transistor; a drain of the ninth transistor respectively connects with the other end of the first capacitor and a source of the tenth transistor; a drain of the third transistor, a drain of the fourth transistor, a drain of the seventh transistor, and a drain of the tenth transistor are connected and then connect with fourth input signals; and
wherein the output unit comprises a plurality of transistors; when the number of the transistors is equal to the number of the clock signals N, gates of the transistors are respectively connected and then connect with a drain of the ninth transistor in the input unit, and drains of the transistors respectively are connected and then connect with fourth input signals, and source of the transistors respectively connect to the common signal points of N/2 number of the GOA units and the gate driving signals.

3. A gate driver on array (GOA) circuit applied in liquid crystal displays, comprising:
a plurality of cascaded GOA units, the cascaded GOA units being configured for respectively outputting gate driving signals of a first level signals to charge corresponding horizontal scanning lines within a display area when being controlled by a plurality of clock signals;
the GOA circuit further comprising a plurality of pull-down maintaining circuits, each of the pull-down maintaining circuits corresponding to at least two cascaded GOA units, and each of the pull-down maintaining circuits being configured for maintaining the corresponding at least two cascaded GOA units to output second level signals as the gate driving signals during a non-operation period.

4. The GOA circuit as claimed in claim 3, wherein when the number of the clock signals is N, each one or each two of the pull-down maintaining circuits corresponds to N/2 of the cascaded GOA units.

5. The GOA circuit as claimed in claim 4, wherein each of the pull-down maintaining circuits comprises an input unit and an output unit; and
the input unit comprises a first transistor, a second transistor, a third transistor, a fourth transistor, a fifth transistor, a sixth transistor, a seven transistor, an eighth transistor, a ninth transistor, a tenth transistor, and a first capacitor; wherein a gate and a source of the first transistor and a source of the second transistor are connected and then connect with first input signals; a drain of the first transistor respectively connects with a source of the third transistor and a gate of the fourth transistor; a gate of the second transistor respectively connects with a gate of the third transistor, and a source and a gate of the fifth transistor; a drain of the second transistor connects with a source of the fourth transistor; a drain of the fifth transistor respectively connects with a drain of the sixth transistor, a source of the seventh transistor, one end of the first capacitor, and a gate of the ninth transistor; a gate and a source of the six transistor are connected and then connects with second input signals; a gate of the seventh transistor connects with a gate of the tenth transistor and reset signals; a gate and a source of the eighth transistor are connected and then connect with a third input signal; a drain of the eighth transistor connects with a source of the ninth transistor; a drain of the ninth transistor respectively connects with the other end of the first capacitor and a source of the tenth transistor; a drain of the third transistor, a drain of the fourth transistor, a drain of the seventh transistor, and a drain of the tenth transistor are connected and then connect with fourth input signals; and
wherein the output unit comprises a plurality of transistors; when the number of the transistors is equal to the number of the clock signals N, gates of the transistors are respectively connected and then connect a drain of the ninth transistor in the input unit, and drains of the transistors are respectively connected and then connect with fourth input signals, and sources of the transistors respectively connect with the common signal points of N/2 number of the GOA units and gate driving signals.

6. The GOA circuit as claimed in claim 5, wherein when the number of the clock signals is eight, each of the pull-down maintaining circuits corresponds to four cascaded GOA units, the first input signals of the pull-down maintaining circuits at the M-th level are a positive-voltage constant-voltage source, the second input signals are level transfer signals at the (M−1)-th level, and the fourth input signals are a negative-voltage constant-voltage source;
wherein the drain of the ninth transistor of the pull-down maintaining circuits at the M-th level outputs the level transfer signals at the M-th level; and
wherein a phase of the third input signals of the pull-down maintaining circuits at the M-th level is opposite to the phase of the third input signals of the pull-down maintaining circuits at the (M+1)-th level.

7. The GOA circuit as claimed in claim 5, wherein when the number of the clock signals is eight, every two pull-down maintaining circuits corresponds to four cascaded GOA units, the first input signals of the pull-down maintaining circuit at the M-th level are first low-frequency signals, the second input signals are the level transfer signals at the (M−2)-th level, the fourth input signals are a negative-voltage constant-voltage source, the first input signals of the pull-down maintaining circuit at the (M+1)-th level are second low-frequency signals, the second input signals are the level transfer signals at the (M−1)-th level, the third input signals are second control signals, and the fourth input signals are a negative-voltage constant-voltage source;
wherein the third input signals of the pull-down maintaining circuit at the M-th level are the same with the third input signals of the pull-down maintaining circuit at the (M+1)-th level, and the phase of the third input signals of the pull-down maintaining circuit at the M-th level is opposite to the phase of the third input signals of two adjacent pull-down maintaining circuits;
wherein the drain of the ninth transistor of the pull-down maintaining circuit at the M-th level outputs the level transfer signals at the M-th level, and the drain of the ninth transistor of the pull-down maintaining circuit at the (M+1)-th level outputs the level transfer signals at the (M+1)-th level.

8. The GOA circuit as claimed in claim 7, wherein the phase of the first low-frequency signals is opposite to the phase of the second low-frequency signals.

9. The GOA circuit as claimed in claim 7, wherein a polarity of the first low-frequency signals and the second low-frequency signals is switched for every pre-determined image frames, and the pre-determined image frames has a range from 1 to 100 frames.

10. The GOA circuit as claimed in claim 7, wherein the pull-down maintaining circuits at the M-th level and at the (M+1)-th level are operated alternatively when being controlled by the first low-frequency signals and the second low-frequency signals.

11. The GOA circuit as claimed in claim 3, wherein the cascaded GOA units comprise an eleventh transistor, a twelfth transistor, a thirteenth transistor, a fourteenth transistor, a fifteenth transistor and a second capacitor; a gate and a source of the eleventh transistor are connected and then connect to turn-on signals at a previous level; a drain of the eleventh transistor respectively connects with a source of the twelfth transistor, a gate of the thirteenth transistor, a gate of the fourteenth transistor, one end of the second capacitor, and a common signal point; a gate of the twelfth transistor connects with a gate of the fifteenth transistor; a source of the thirteenth transistor and a source of the fourteenth transistor are connected and then connects with the clock signals; a drain of the thirteenth transistor outputs the turn-on signals at a current level, a drain of the fourteenth transistor respectively connects with the other end of the second capacitor and the source of the fifteenth transistor to output the gate driving signals; and a drain of the twelfth transistor and a drain of the fifteenth transistor connect with a negative-voltage constant-voltage source.

12. A liquid crystal display, comprising:
a gate driver on array (GOA) circuit;
wherein the GOA circuit comprises a plurality of cascaded GOA units, the cascaded GOA units are configured for respectively outputting gate driving signals of first level signals to charge corresponding horizontal scanning lines within a display area when being controlled by a plurality of clock signals; and
the GOA circuit further comprises a plurality of pull-down maintaining circuits, each of the pull-down maintaining circuits corresponds to at least two cascaded GOA units, and each of the pull-down maintaining circuits is configured for maintaining the corresponding at least two cascaded GOA units to output second level signals as the gate driving signals during a non-operation period.

13. The liquid crystal display as claimed in claim 12, wherein when the number of the clock signals is N, each one or each two of the pull-down maintaining circuits corresponds to N/2 of the cascaded GOA units.

14. The liquid crystal display as claimed in claim 13, wherein each of the pull-down maintaining circuits comprises an input unit and an output unit; and the input unit comprises a first transistor, a second transistor, a third transistor, a fourth transistor, a fifth transistor, a sixth transistor, a seven transistor, an eighth transistor, a ninth transistor, a tenth transistor, and a first capacitor; wherein a gate and a source of the first transistor and a source of the second transistor are connected and then connect with first input signals; a drain of the first transistor respectively connects with a source of the third transistor and a gate of the fourth transistor; a gate of the second transistor respectively connects with a gate of the third transistor, and a source and a gate of the fifth transistor; a drain of the second transistor connects with a source of the fourth transistor; a drain of the fifth transistor respectively connects with a drain the sixth transistor, a source of the seventh transistor, one end of the first capacitor, and a gate of the ninth transistor; a gate and a source of the six transistor are connected and then connects with second input signals; a gate of the seventh transistor connects with a gate of the tenth transistor and reset signals; a gate and a source of the eighth transistor are connected and then connect with third input signals; a drain of the eighth transistor connects with a source of the ninth transistor; a drain of the ninth transistor respectively connects with the other end of the first capacitor and a source of the tenth transistor; a drain of the third transistor, a drain of the fourth transistor, a drain of the seventh transistor, and a drain of the tenth transistor are connected and then connect with fourth input signals; and wherein the output unit comprises a plurality of transistors; when the number of the transistors is equal to the number of the clock signals N, gates of the transistors are respectively connected and then connect with a drain of the ninth transistor in the input unit, and drains of the transistors are respectively connected and then connect with fourth input signals, and sources of the transistors respectively connect with the common signal points of N/2 number of the GOA units and gate driving signals.

15. The liquid crystal display as claimed in claim 14, wherein when the number of the clock signals is eight, each of the pull-down maintaining circuits corresponds to four cascaded GOA units, the first input signals of the pull-down maintaining circuit at the M-th level are a positive-voltage constant-voltage source, the second input signals are level transfer signals at (M−1)-th level, and the fourth input signals are a negative-voltage constant-voltage source;

wherein the pull-down maintaining circuits at the M-th level and the drain of the ninth transistor outputs the level the transfer signals at the M-th level; and wherein a phase of the third input signals of the pull-down maintaining circuits at the M-th level is opposite to the phase of the third input signals of the pull-down maintaining circuits at the (M+1)-th level.

16. The liquid crystal display as claimed in claim 14, wherein when the number of the clock signals is eight, every two pull-down maintaining circuits corresponds to four cascaded GOA units, the first input signals of the pull-down maintaining circuits at the M-th level are first low-frequency signals, the second input signals are the level transfer signals at the (M−2)-th level, the fourth input signals are a negative-voltage constant-voltage source, the first input signals of the pull-down maintaining circuit at the (M+1)-th level are second low-frequency signals, the second input signals are the level transfer signals at the (M−1)-th level, the third input signals are second control signals, and the fourth input signals are a negative-voltage constant-voltage source;

wherein the third input signals of the pull-down maintaining circuit at the M-th level are the same with the third input signals of the pull-down maintaining circuit at the (M+1)-th level, and the phase of the third input signals of the pull-down maintaining circuit at the M-th level is opposite to the phase of the third input signals of two adjacent pull-down maintaining circuits;

wherein the drain of the ninth transistor of the pull-down maintaining circuit at the M-th level outputs the level transfer signals at the M-th level, and the drain of the ninth transistor of the pull-down maintaining circuit at the (M+1)-th level outputs the level transfer signals at the (M+1)-th level.

17. The liquid crystal display as claimed in claim 16, wherein the phase of the first low-frequency signals is opposite to the phase of the second low-frequency signals.

18. The liquid crystal display as claimed in claim 16, wherein a polarity of the first low-frequency signals and the second low-frequency signals is switched for every pre-determined image frames, and the pre-determined image frames has a range from 1 to 100 frames.

19. The liquid crystal display as claimed in claim 16, wherein the pull-down maintaining circuits at the M-th level and at the (M+1)-th level are operated alternatively when being controlled by the first low-frequency signals and the second low-frequency signals.

20. The liquid crystal display as claimed in claim 12, wherein the cascaded GOA units comprise an eleventh transistor, a twelfth transistor, a thirteenth transistor, a fourteenth transistor, a fifteenth transistor and a second capacitor; a gate and a source of the eleventh transistor are connected and then connect to turn-on signals at a previous level; a drain of the eleventh transistor respectively connects with a source of the twelfth transistor, a gate of the thirteenth transistor, a gate of the fourteenth transistor, one end of the second capacitor, and a common signal point; a gate of the twelfth transistor connects with a gate of the fifteenth transistor; a source of the thirteenth transistor and a source of the fourteenth transistor are connected and then connects with the clock signals; a drain of the thirteen transistor outputs the turn-on signals at a current level; a drain of the fourteenth transistor respectively connects with the other end of the second capacitor and the source of the fifteenth transistor to output the gate driving signals; and a drain of the twelfth transistor and a drain of the fifteenth transistor connect with a negative-voltage constant-voltage source.

* * * * *